(12) United States Patent
Negishi et al.

(10) Patent No.: US 11,062,925 B2
(45) Date of Patent: Jul. 13, 2021

(54) SEMICONDUCTOR MANUFACTURING APPARATUS AND METHOD OF MANUFACTURING SEMICONDUCTOR DEVICE

(71) Applicant: Mitsubishi Electric Corporation, Tokyo (JP)

(72) Inventors: Masato Negishi, Tokyo (JP); Kazuo Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/848,938

(22) Filed: Apr. 15, 2020

(65) Prior Publication Data

US 2020/0365430 A1  Nov. 19, 2020

(30) Foreign Application Priority Data

May 17, 2019  (JP) .............................. JP2019-093831

(51) Int. Cl.
  *B32B 43/00*  (2006.01)
  *H01L 21/67*  (2006.01)
  *B32B 38/10*  (2006.01)

(52) U.S. Cl.
  CPC ...... *H01L 21/67132* (2013.01); *B32B 43/006* (2013.01); *B32B 38/10* (2013.01); *Y10S 156/932* (2013.01); *Y10S 156/943* (2013.01); *Y10T 156/1179* (2015.01); *Y10T 156/1983* (2015.01)

(58) Field of Classification Search
  CPC . B32B 38/10; B32B 43/006; Y10T 156/1179; Y10T 156/1983; Y10S 156/932; Y10S 156/943
  See application file for complete search history.

(56) References Cited

U.S. PATENT DOCUMENTS

| 5,589,029 | A | * | 12/1996 | Matsui | ............... | H05K 13/0421 |
| | | | | | | 156/765 |
| 6,139,676 | A | * | 10/2000 | Fernandez | .............. | B32B 38/10 |
| | | | | | | 156/707 |
| 6,709,543 | B2 | * | 3/2004 | Kurosawa | ......... | H01L 21/67092 |
| | | | | | | 156/716 |
| 6,824,643 | B2 | * | 11/2004 | Yoshimoto | ........ | H01L 21/67132 |
| | | | | | | 156/716 |
| 9,305,812 | B2 | * | 4/2016 | Amin | ................. | H01L 21/68778 |
| 2005/0006029 | A1 | * | 1/2005 | Suzuki | .............. | H01L 21/67132 |
| | | | | | | 156/764 |
| 2006/0237142 | A1 | * | 10/2006 | Park | .................... | B29C 63/0013 |
| | | | | | | 156/765 |
| 2008/0173407 | A1 | * | 7/2008 | Min | ................... | H01L 21/67011 |
| | | | | | | 156/765 |
| 2010/0252205 | A1 | * | 10/2010 | Chan | ................. | H01L 21/67132 |
| | | | | | | 156/758 |

(Continued)

FOREIGN PATENT DOCUMENTS

JP  2016195194 A  11/2016

*Primary Examiner* — Mark A Osele
*Assistant Examiner* — Nickolas R Harm
(74) *Attorney, Agent, or Firm* — Studebaker & Brackett PC

(57) ABSTRACT

By using a needle having a flat part on a top surface and concave portions at four corners of the top surface, the semiconductor chip pasted on the adhesive tape is pushed up, and the adhesive tape at four corners of the semiconductor chip are uniformly peeled off. Then, the pickup is performed.

9 Claims, 13 Drawing Sheets

(56) References Cited

U.S. PATENT DOCUMENTS

| | | | |
|---|---|---|---|
| 2012/0244647 A1* | 9/2012 | Okamoto | H01L 21/67271 438/15 |
| 2014/0060751 A1* | 3/2014 | Yamamoto | H01L 21/67132 156/758 |
| 2016/0293463 A1 | 10/2016 | Nishizaki et al. | |

* cited by examiner

SEMICONDUCTOR MANUFACTURING APPARATUS AND METHOD OF MANUFACTURING SEMICONDUCTOR DEVICE

BACKGROUND OF THE INVENTION

Field

The present disclosure relates to a semiconductor manufacturing apparatus that pushes up, using a needle, a semiconductor held to an adhesive tape and diced into semiconductor chips, and suctions and picks up the semiconductor chips using a collet.

Background

Steps of manufacturing semiconductor devices include applying tensile stress to an adhesive tape such as a dicing tape to expand the adhesive tape, picking up individual semiconductor chips from the adhesive tape and mounting the picked-up semiconductor chips on a circuit substrate or the like. A pickup apparatus includes a stage on which a holding member holding the adhesive tape is placed, a top photographing camera that detects positions of the semiconductor chips from above the stage, a push-up member that pushes up the semiconductor chips from below the stage and a collet that picks up the semiconductor chips from above (e.g., see JP 2016-195194 A).

SUMMARY

With the above-described conventional semiconductor manufacturing apparatus, when the semiconductor chips are picked up and the semiconductor chips on the adhesive tape are pushed up from below, if an adhesion state between the adhesive tape and each semiconductor chip is non-uniform, the way each semiconductor chip is peeled off from the adhesive tape varies. This may cause misalignment of the semiconductor chips or tearing off of the tape, resulting in a problem that pickup is not performed stably under the same condition.

The present disclosure has been implemented to solve the above-described problem and it is an object of the present disclosure to obtain a semiconductor manufacturing apparatus capable of picking up semiconductor chips from an adhesive tape stably without causing misalignment or tearing off of the tape.

A semiconductor manufacturing apparatus according to the present disclosure includes: a holding member holding an adhesive tape on which a semiconductor chip is pasted; a pickup stage on which the holding member is placed; a stage drive section controlling a movement of the pickup stage; a top photographing camera positioned above the pickup stage and photographing a position of the semiconductor chip; a positioning detection section detecting positional information of the semiconductor chip based on video information provided from the top photographing camera; a collet picking up the semiconductor chip; a collet drive section controlling the collet; a needle located below the pickup stage, having a width equivalent to that of the semiconductor chip, having a flat part on a top surface and concave portions at four corners of the top surface, and pushing up a holding member for pickup of the semiconductor chip; a needle stage holding the needle; a push-up drive section driving the needle stage; and a control section instructing the stage drive section to move the stage based on the positional information from the positioning detection section, instructing the push-up drive section to push up the semiconductor chip, and instructing the collet drive section to suction the semiconductor chip pushed up by the needle from above.

In the semiconductor manufacturing apparatus according to the present disclosure, the semiconductor chip can be peeled off from the adhesive tape set on the holding member in the same state, and stable pickup can be performed.

Other and further objects, features and advantages of the invention will appear more fully from the following description.

BRIEF DESCRIPTION OF DRAWINGS

FIG. 19 is a flowchart of operation of the pickup apparatus of the second embodiment in the pickup step S3a.

DESCRIPTION OF EMBODIMENTS

A semiconductor manufacturing apparatus according to the embodiments of the present disclosure will be described with reference to the drawings. The same components will be denoted by the same symbols, and the repeated description thereof may be omitted.

First Embodiment

Figure 1:
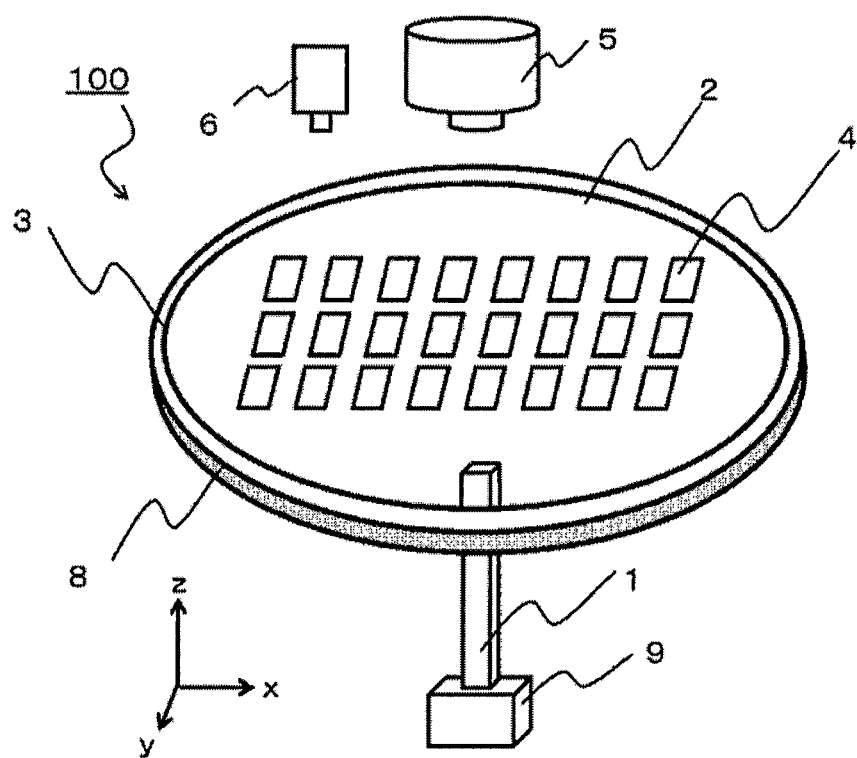
FIG. 1 is a perspective view of the pickup apparatus of the first embodiment.

First, a configuration of a pickup apparatus 100 according to a semiconductor manufacturing apparatus of a first embodiment of the present disclosure will be described. FIG. 1 is a perspective view of the pickup apparatus 100 illustrating an example of the configuration of the present embodiment. The pickup apparatus 100 includes a pickup stage 8 for placing a ring-shaped holding member 3 with semiconductor chips 4 pasted on an expanded adhesive tape 2, a top photographing camera 6 that detects positional information about an arrangement of the semiconductor chips 4 above the pickup stage 8, a needle 1 having a flat top surface with cutout portions at four corners configured to push up the semiconductor chips 4 from below the pickup stage 8, a needle stage 9 that holds and pushes up the needle 1, and a collet 5 that picks up the semiconductor chips from above. Note that FIG. 1 illustrates an x direction, a y direction and a z direction, assuming that an upward direction corresponds to the z direction, and horizontal directions orthogonal to the z direction are the x direction and the y direction. When there are similar illustrations showing the x direction, the y direction and the z direction in drawings other than FIG. 1, such illustrations are assumed to show orientations similar to those in FIG. 1 respectively.

Figure 2:
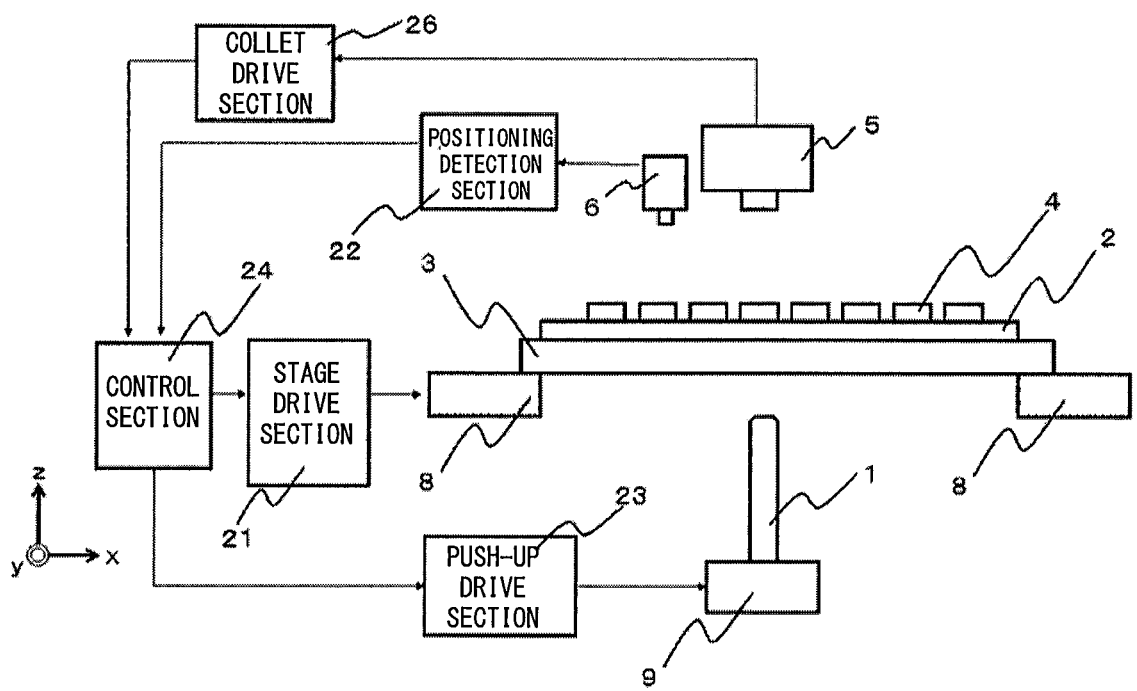
FIG. 2 is a block diagram illustrating the configuration of the pickup apparatus of the first embodiment.

FIG. 2 is a block diagram illustrating a configuration of the pickup apparatus 100 according to the first embodiment of the present disclosure. The pickup apparatus 100 includes a push-up drive section 23 that controls the needle stage 9 that moves the needle 1 up and down, a stage drive section 21 that controls the position of the pickup stage 8 in the horizontal direction, and a positioning detection section 22 that detects positional information about the arrangement of the semiconductor chips 4, and further includes the push-up drive section 23, and a control section 24 that controls the stage drive section 21 and the positioning detection section 22.

The pickup apparatus 100 includes the pickup stage 8 on which the ring-shaped holding member 3 holding the adhesive tape 2 with the semiconductor chips 4 pasted thereon is placed. The top photographing camera 6 for photographing the positions of the semiconductor chips 4 is positioned above the pickup stage 8. Video information from the top photographing camera 6 is transmitted to the positioning detection section 22, and the positional information about the detected arrangement of the semiconductor chips 4 is sent to the control section 24. Based on the positional information transmitted from the positioning detection section 22, the control section 24 sends a signal, which is a command for moving the pickup stage 8, to the stage drive section 21. Next, the control section 24 sends a signal, which is a command for driving the needle stage 9 to perform pushup, to the push-up drive section 23. Furthermore, the control section 24 sends a signal for instructing the collet drive section 26 to cause the collet 5 to suction and pick up the semiconductor chips 4 on the adhesive tape 2 from above, which have been pushed up by the needle 1.

Figure 3:
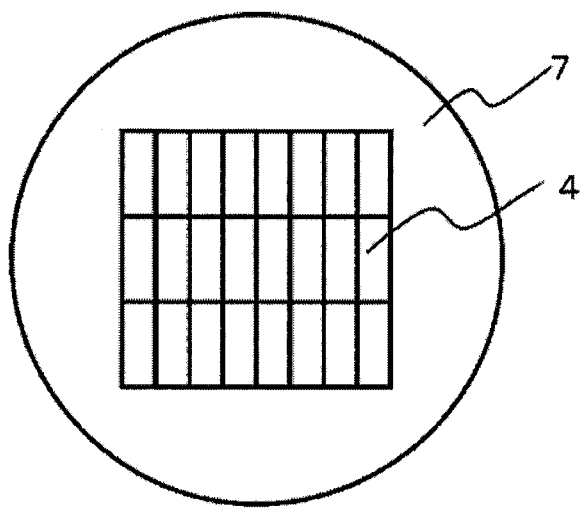
FIG. 3 is a top view of the semiconductor substrate illustrating the state before dicing of the semiconductor chip to be picked up by the pickup apparatus of the first embodiment.

FIG. 3 is a top view of a semiconductor substrate 7 illustrating the semiconductor chip 4 before dicing. A plurality of semiconductor chips 4 are arranged on the surface of the semiconductor substrate 7 in an array in matrix directions, the semiconductor substrate 7 is pasted on the adhesive tape 2 and diced, and further, the adhesive tape 2 is expanded, thereby creating individual semiconductor chips 4.

Figure 4:
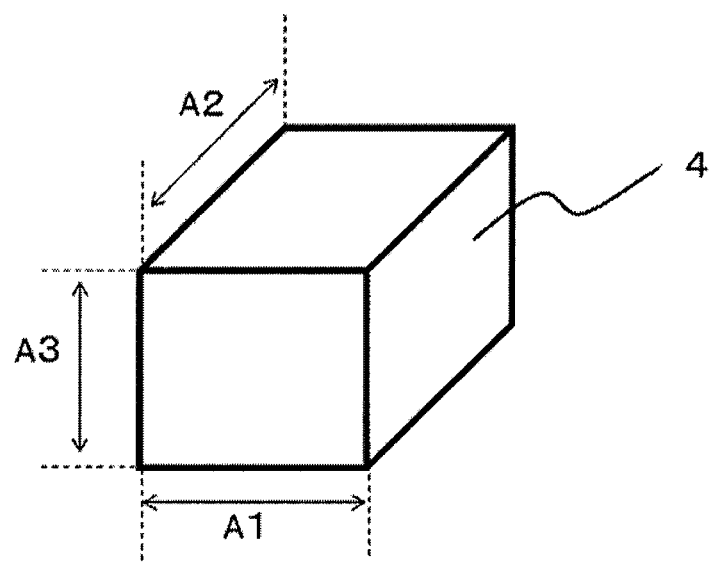
FIG. 4 is a perspective view of the semiconductor chip to be picked up by the pickup apparatus of the first embodiment.

FIG. 4 is a perspective view of each semiconductor chip 4 to be picked up by the pickup apparatus 100 according to the semiconductor manufacturing apparatus of the first embodiment of the present disclosure. Each semiconductor chip 4 cut out from the semiconductor substrate 7 has a rectangular shape having a width A1, a length A2 in a depth direction and a height A3.

Figure 5:
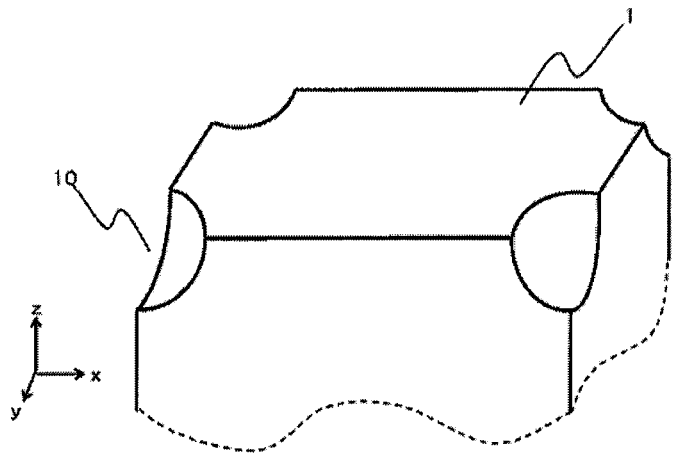
FIG. 5 is an enlarged perspective view illustrating a distal end portion of the needle of the pickup apparatus of the first embodiment.

FIG. 5 is an enlarged perspective view of a distal end portion of the needle 1 of the pickup apparatus 100 according to the semiconductor manufacturing apparatus of the first embodiment of the present disclosure. Illustration of the portion below a broken line is omitted. The needle 1 has a rectangular parallelepiped shape of which a top surface coming into contact with each semiconductor chip 4 through the adhesive tape 2 has a flat shape with a size equivalent to the semiconductor chip 4 with respect to the width A1 and the depth A2 of the semiconductor chip 4, and has cutout portions 10 with its four sides being cut out. Note that the cutout portions 10 with the four sides being cut out have the meaning that the four sides have concave portions with concave shapes, which does not necessarily mean that those portions are actually cut out. For instance, the cutout portions 10 may be formed by casting.

Figure 6:
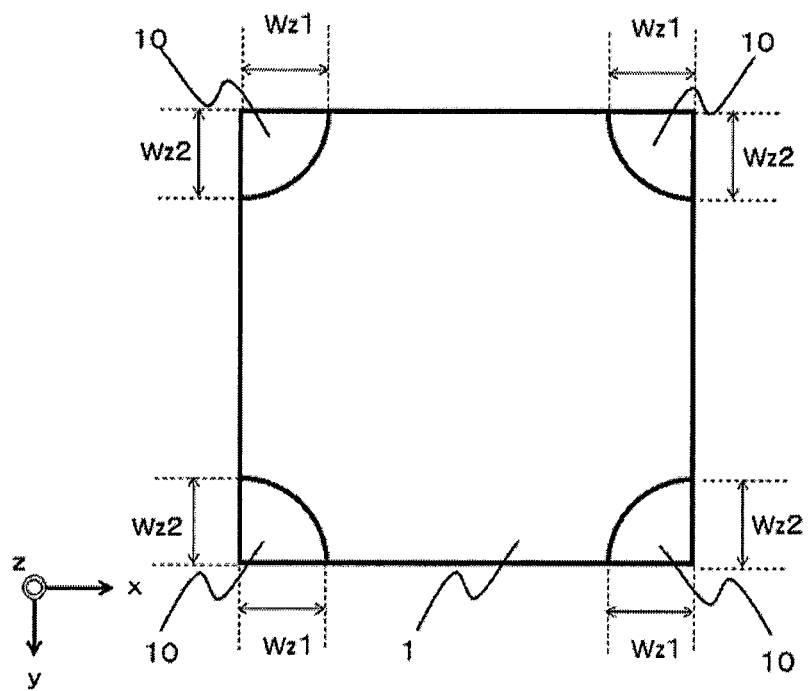
FIG. 6 is a top view of the needle of the pickup apparatus of the first embodiment.
Figure 7:
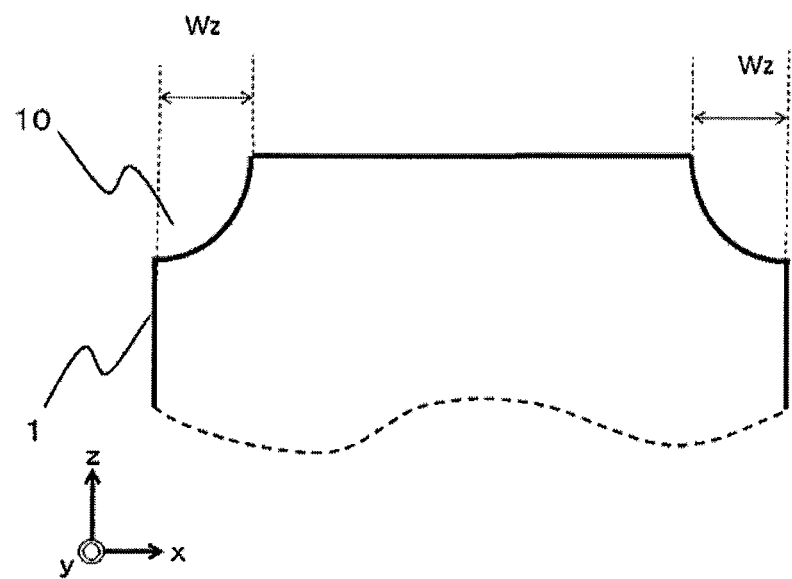
FIG. 7 is a cross-sectional view of the needle of the pickup apparatus of the first embodiment viewed from the side.

FIG. 6 is a top view of the needle 1 of the pickup apparatus 100 according to the semiconductor manufacturing apparatus of the first embodiment of the present disclosure and is a diagram viewed from a positive direction of the z axis. The top surface where the needle 1 is in contact with the semiconductor chips 4 has a flat shape. The cutout portions 10 are formed by cutting out four sides of the top surface in the size of Wz1 in the x direction and in the size of Wz2 in the y direction. In FIG. 6, a top surface shape of the one of the cutout portions 10 is a curved surface corresponding to a one-fourth circle, but the top surface shape of the needle 1 is not limited to this. FIG. 7 is a cross-sectional view of the needle 1 of the pickup apparatus 100 according to the semiconductor manufacturing apparatus of the first embodiment of the present disclosure viewed from the side. In the cutout portions 10, notations by Wz1 and Wz2 are collectively represented by Wz.

Next, a method of manufacturing a semiconductor device including operation of the pickup apparatus 100 according to the semiconductor manufacturing apparatus of the first embodiment of the present disclosure will be described. Here, the semiconductor device refers to a semiconductor device or a semiconductor module such as a high frequency device, an optical device or a power module, but the semiconductor device is not limited to this, and any device using a semiconductor may be used. Hereinafter, a high frequency device will be described as an example of the semiconductor device.

Figure 8:
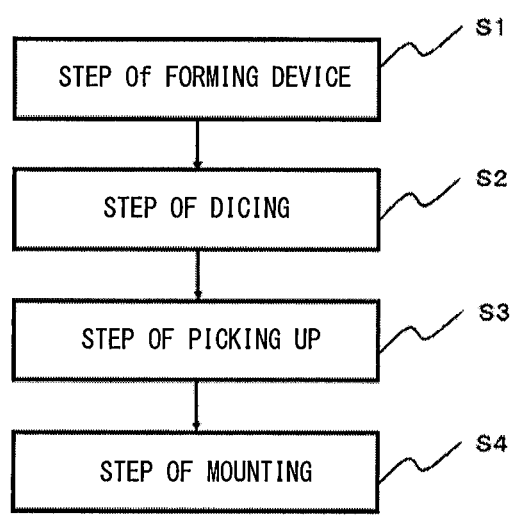
FIG. 8 is a flowchart to describe the method of manufacturing a high frequency device.

FIG. 8 is a flowchart to describe the method of manufacturing a high frequency device. The high frequency device is manufactured in steps including step S1 of forming a device on the surface of a semiconductor wafer, step S2 of pasting the semiconductor substrate 7 on the adhesive tape 2 and dicing the semiconductor substrate 7 into individual semiconductor chips 4, step S3 of picking up the semiconductor chips 4 from the adhesive tape 2 and step S4 of mounting the picked-up semiconductor chips 4 on a circuit substrate or the like.

In step S1, devices such as a high frequency transistor, a capacitor, a resistor are formed on the surface of a semiconductor wafer using a semiconductor process. In step S2, the semiconductor wafer on which the devices are formed is pasted on the adhesive tape 2 and diced into individual semiconductor chips 4.

In step S3, the adhesive tape 2 on which the semiconductor chips 4 are arranged is expanded first and set on the ring-shaped holding member 3. Next, the semiconductor chips 4 are picked up from the adhesive tape 2 using the pickup apparatus 100 shown in FIG. 2.

Step S3 will be described more specifically. In FIG. 2, the ring-shaped holding member 3 where the adhesive tape 2 on which the semiconductor chips 4 are arranged is expanded and held, is set on the pickup stage 8 of the pickup apparatus 100. The semiconductor chips 4 are photographed by the top photographing camera 6, positions of the semiconductor chips 4 are detected by the positioning detection section 22 and positional information is transmitted to the control section 24. The control section 24 transmits the positional information of the semiconductor chips 4 to the stage drive section 21 that moves the pickup stage 8, and the stage drive section 21 moves the pickup stage 8 to positions for the pickup stage 8 to pick up the semiconductor chips 4. At the same time, the control section 24 transmits information about timing to the push-up drive section 23 for the push-up drive section 23 to perform push-up, sends a command to the push-up needle stage 9 so as to perform push-up after the pickup stage 8 arrives at a position for pickup, and performs push-up of the needle 1. The needle 1 pushes up the semiconductor chips 4 through the adhesive tape 2 and peels off the four corners of the semiconductor chips 4 from the adhesive tape 2. In accordance with this, the collet 5 suctions the semiconductor chips 4 from above, moves the semiconductor chips 4 in the z direction and performs pick-up.

Figure 9:
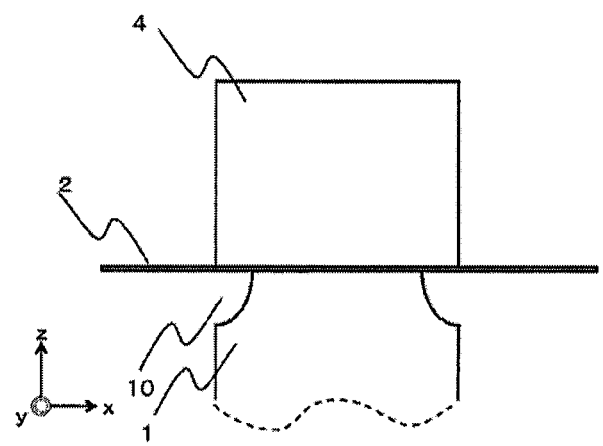
FIG. 9 is a cross-sectional view of the needle of the pickup apparatus of the first embodiment coming into contact with the semiconductor chip through the adhesive tape.

FIG. 9 is a cross-sectional view of the needle 1 of the pickup apparatus 100 according to the semiconductor manufacturing apparatus of the first embodiment just when the needle 1 moves upward to push up the semiconductor chips 4 through the adhesive tape 2 and comes into contact with the adhesive tape 2. This is assumed to be a diagram seen from a positive direction of the y axis, but a diagram seen from a positive direction of the x axis is also the same. The flat part of the top surface of the needle 1 comes into contract with the bottom surface of the semiconductor chips 4 through the adhesive tape 2 and the adhesive tape 2 is sandwiched between the top surface flat part of the needle 1 and the bottom surface of the semiconductor chip 4.

Figure 10:
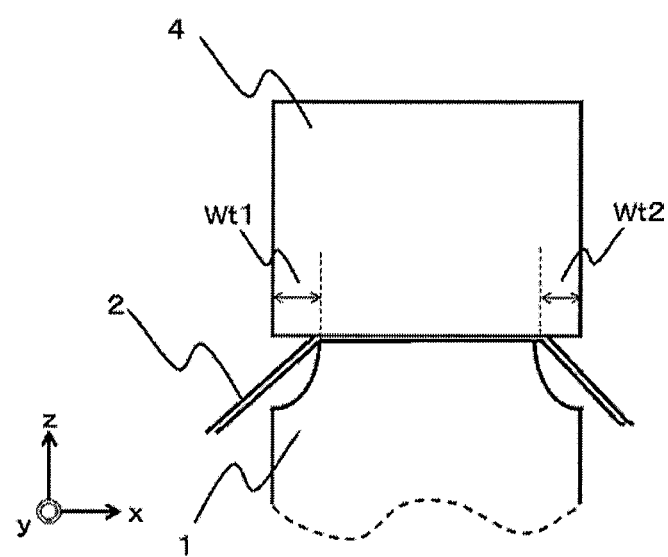
FIG. 10 is a cross-sectional view illustrating a state that the needle of the pickup apparatus of the first embodiment pushes up the semiconductor chip and the adhesive tape and an end of the semiconductor chip is peeled off from the adhesive tape.

FIG. 10 is a cross-sectional view when the needle 1 of the pickup apparatus 100 according to the semiconductor manufacturing apparatus of the first embodiment pushes up the semiconductor chip 4 pasted on the adhesive tape 2, the adhesive tape 2 and the semiconductor chip 4 are lifted up and ends of the semiconductor chip 4 are peeled off from the adhesive tape 2. The portion of the adhesive tape 2 sandwiched between the top surface flat part of the needle 1 and the bottom surface of the semiconductor chip 4 vertically is not peeled off even when it is pushed up, whereas because the adhesive tape 2 is pulled downward, the portion of the adhesive tape 2 corresponding to the cutout portions 10 of the needle 1 is peeled off by Wt1 or Wt2 equivalent to the size Wz of the cutout portions 10 from the semiconductor chips 4.

Figure 11:
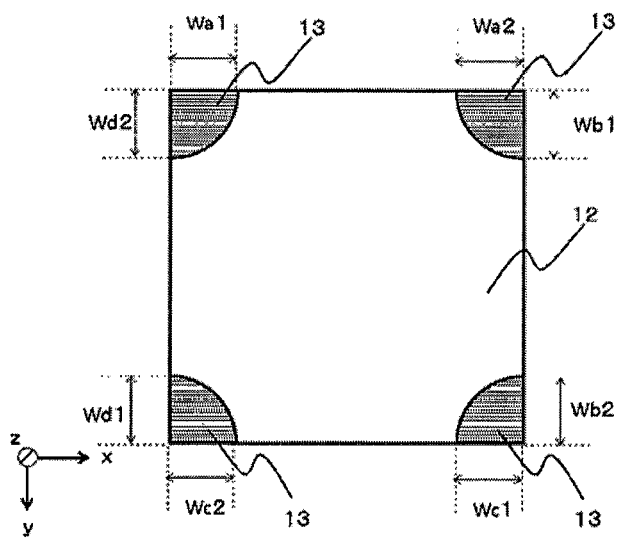
FIG. 11 is a bottom view illustrating a state that the needle of the pickup apparatus of the first embodiment pushes up the semiconductor chip and the adhesive tape and an end of the semiconductor chip is peeled off from the adhesive tape.

FIG. 11 illustrates the adhesive tape 2 peeled off from the semiconductor chip 4 in FIG. 10 when seen from below and from the negative direction of the z axis. Peeled parts 13 are produced at four corners and their sizes are Wa1, Wa2, Wc1 and Wc2 in the x direction and Wd1, Wd2, Wb1 and Wb2 in the y direction. Wa1, Wb1, Wc1 and Wd1 conform to Wt1 in FIG. 11, and Wa2, Wb2, Wc2 and Wd2 conform to Wt2 in FIG. 10. Since Wt1 and Wt2 are equivalent in size to Wz of the cutout portions 10, the peeled parts 13 of equivalent sizes are produced at the four corners.

However, in a case where push-up was performed using one conventional pointed needle 11 used for the conventional semiconductor manufacturing apparatus, no peeled parts of equivalent sizes were obtained at the four corners.

Figure 12:
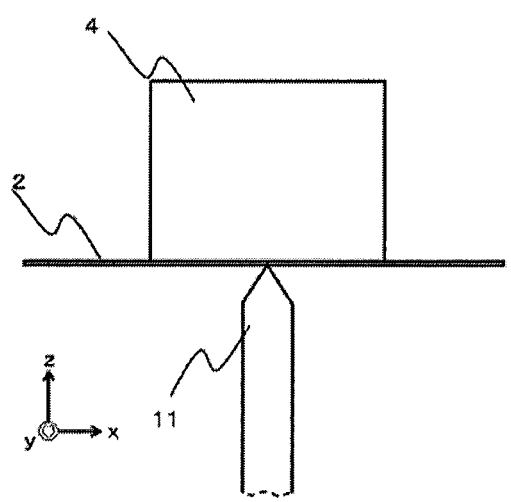
FIG. 12 is a cross-sectional view illustrating a state that the needle of the conventional pickup apparatus moves upward to push up the semiconductor chip pasted on the adhesive tape and comes into contact with the adhesive tape.

FIG. 12 is a cross-sectional view when the conventional needle 11 of the conventional semiconductor manufacturing apparatus moves upward to push up each semiconductor chip 4 pasted on the adhesive tape 2 and comes into contact with the adhesive tape 2. Although FIG. 12 is a diagram seen from the positive direction of the y axis, the diagram seen from the positive direction of the x axis is also the same. Only the distal end portion of the conventional needle 11 is in contact with the semiconductor chips 4 through the adhesive tape 2.

Figure 13:
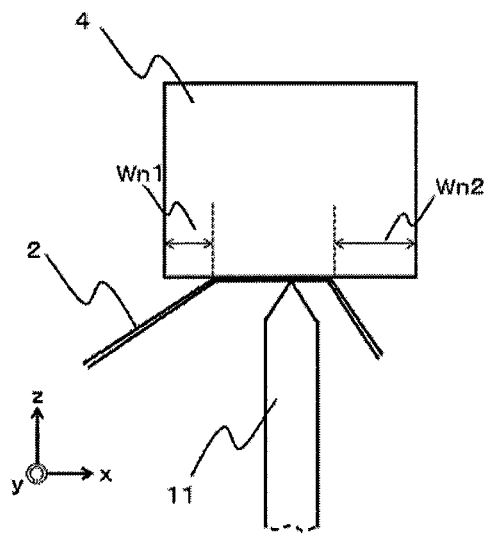
FIG. 13 is a cross-sectional view illustrating a state that the needle of the conventional pickup apparatus pushes up the semiconductor chip pasted on the adhesive tape.

FIG. 13 is a cross-sectional view when the conventional needle 11 of the conventional semiconductor manufacturing apparatus pushes up the semiconductor chip 4 pasted on the adhesive tape 2. Since there is only one contact point between the conventional needle 11 and the bottom surface of the semiconductor chip 4, an adhesive force at an adhesion surface between the semiconductor chip 4 and the adhesive tape 2 is not uniform due to, for example, foreign substance attached to the bottom surface of the semiconductor chip 4, non-uniformity of an adhesive material of the adhesive tape 2, portions of the adhesive tape 2 having a weak adhesive force are likely to peel off from the semiconductor chip 4, and a difference is produced between Wn1 and Wn2.

Figure 14:
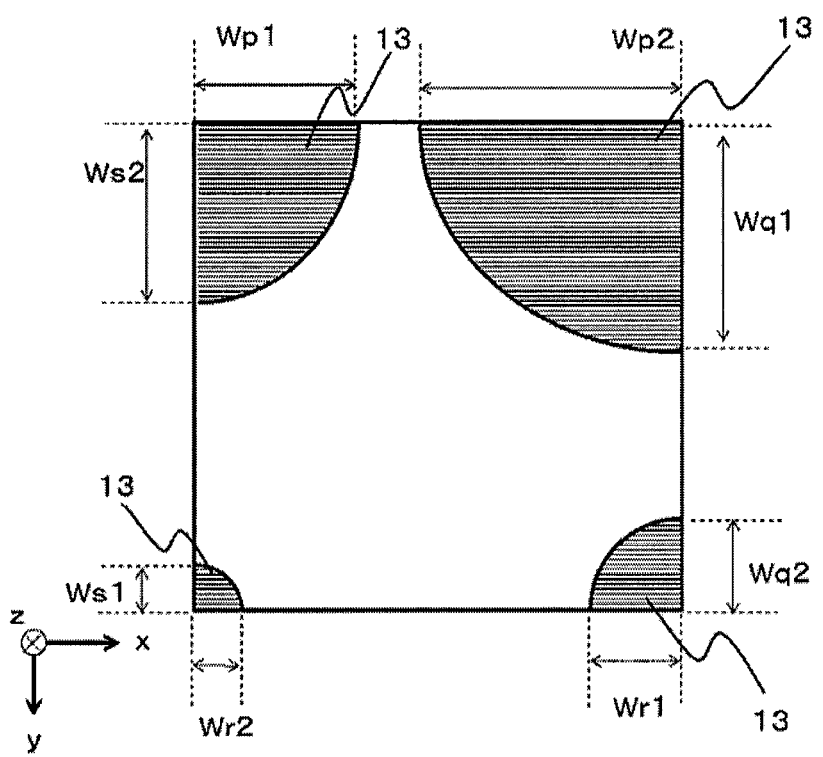
FIG. 14 is a bottom view illustrating a state that the needle of the conventional pickup apparatus pushes up the semiconductor chip pasted on the adhesive tape and the semiconductor chip is peeled off from the adhesive tape.

FIG. 14 is a cross-sectional view of the adhesive tape 2 in FIG. 13 peeled off from the semiconductor chip 4, seen from below and from the negative direction of the z axis. Peeling amounts of the peeled parts 13 of the adhesive tape 2 from the semiconductor chip 4 are Wp1, Wp2, Wr1 and Wr2 in the x direction and Ws1, Ws2, Wq1 and Wq2 in the y direction. In FIG. 13, Wp1, Wq1, Wr1 and Ws1 are collectively represented by Wn1, and Wp2, Wq2, Wr2 and Ws2 are collectively represented by Wn2. Since differences are produced in Wn1 and Wn2, an adhesion state between the semiconductor chip 4 and the adhesive tape 2 varies for each semiconductor chip 4 or each adhesive tape 2 and becomes non-uniform, so that the semiconductor chips 4 may be misaligned.

On the other hand, in the pickup apparatus 100 according to the semiconductor manufacturing apparatus of the first embodiment of the present disclosure, when the semiconductor chips 4 are picked up using the collet 5, the four corners of the semiconductor chips 4 are uniformly peeled off from the adhesive tape 2 in the adhesion state between the semiconductor chips 4 and the adhesive tape 2, and therefore the semiconductor chips 4 are not misaligned, the adhesion state between the semiconductor chips 4 and the adhesive tape 2 is also stable, making it possible to stably perform pickup. By performing push-up using the needle 1 of the pickup apparatus 100 according to the semiconductor device of the first embodiment, peeling occurs uniformly at four corners of the semiconductor chips 4 from the adhesive tape 2 and it is possible to stably perform pickup without causing misalignment.

Next, in step S4, the semiconductor chip 4 picked up by the pickup apparatus 100 is mounted on the circuit substrate or the like. The circuit substrate mounted with a high frequency device constitutes, for example, a high frequency module or a power amplifier module for a base station.

Figure 15:
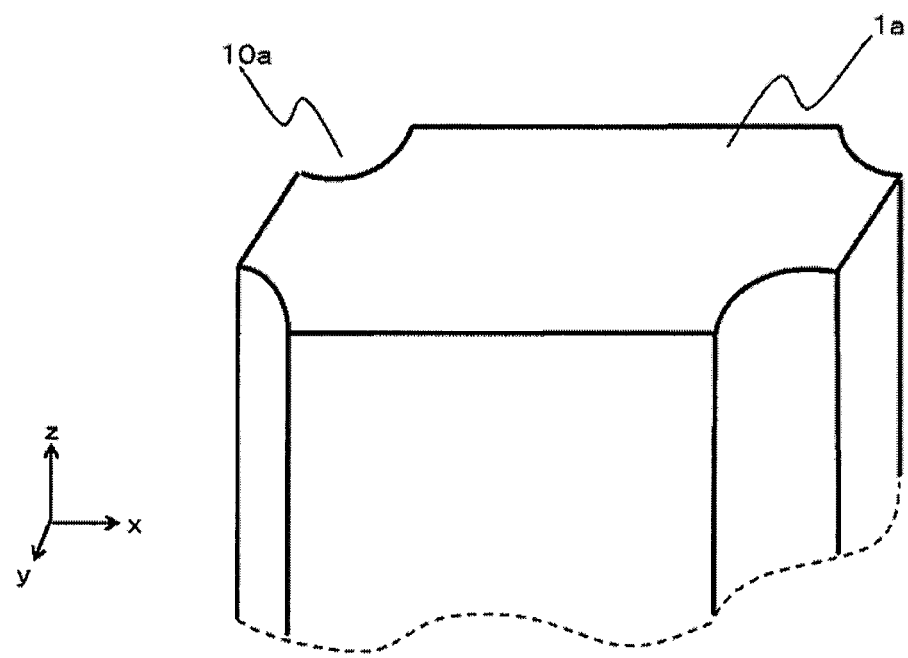
FIG. 15 is an enlarged perspective view illustrating the first modification of a distal end portion of the needle of the pickup apparatus of the first embodiment.

Next, a needle 1a, which is a first modification of the needle of the pickup apparatus 100 according to the semiconductor manufacturing apparatus of the present first embodiment will be described. FIG. 15 is an enlarged perspective view of a distal end portion of the needle 1a, and illustration below a broken line is omitted.

The needle 1a has a rectangular parallelepiped shape of which a top surface coming into contact with each semiconductor chip 4 through the adhesive tape 2 has a flat shape with a size equivalent to the semiconductor chip 4 with respect to the width A1 and the depth A2 of the semiconductor chip 4, and has cutout portions 10a with its four sides being cut out in the z axis direction. Note that the cutout portions 10a with the four sides being cut out have the meaning that the four sides have concave portions with concave shapes, which does not necessarily mean that those portions are actually cut out. For instance, the cutout portions 10 may be formed by casting.

The cutout portions 10a of the needle 1a according to the first modification extends to a lower part of the needle 1a, and therefore, there is a positive effect that the needle 1a is easy to manufacture and requires less manufacturing materials. The pickup apparatus 100 in the first modification uses the needle 1a to push up the semiconductor chips 4, and is the same in other aspects.

Figure 16:
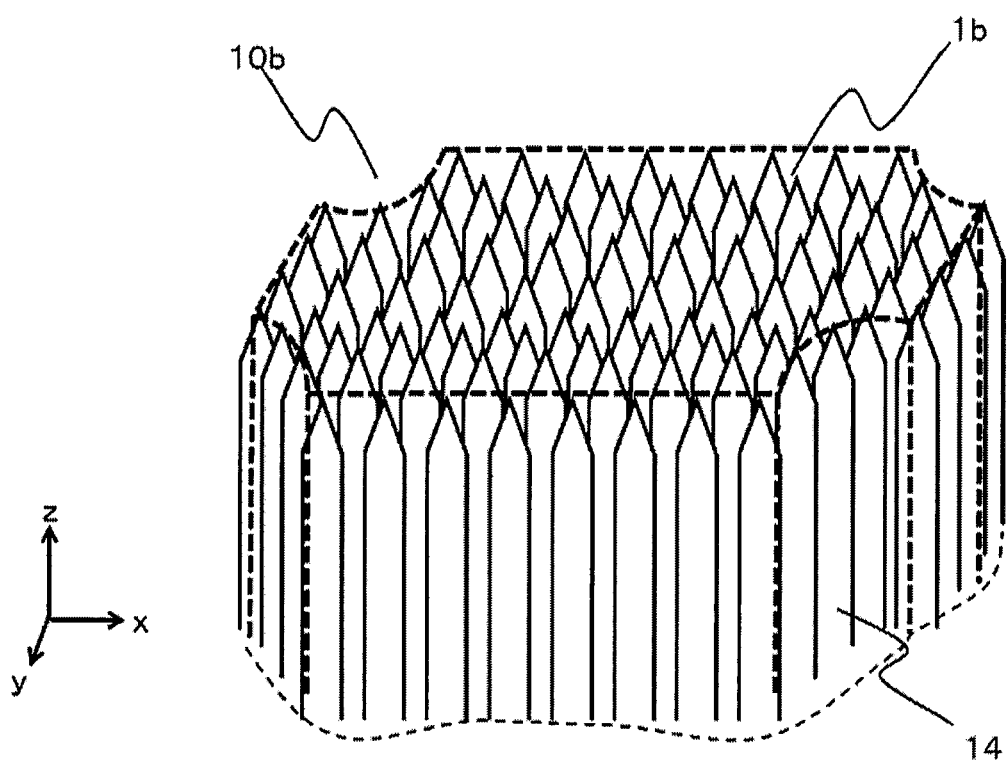
FIG. 16 is an enlarged perspective view illustrating the second modification of a distal end portion of the needle of the pickup apparatus of the first embodiment.

Next, a needle 1b, which is a second modification of the needle of the pickup apparatus 100 according to the semiconductor manufacturing apparatus of the present first embodiment, will be described. FIG. 16 is an enlarged perspective view of a distal end portion of the needle 1b of the pickup apparatus 100 according to the semiconductor manufacturing apparatus of the present first embodiment, and illustration of the portion below a broken line of the needle 1b is omitted. A body similar to the needle 1a of the first modification includes an aggregate formed by arranging thin needle pieces 14 in parallel with their longitudinal sides oriented along the z-axis direction. More specifically, a flat top part is formed by arranging distal end portions of the plurality of thin needle pieces 14 on an x-y plane at the same height, and by not arranging the thin needle pieces 14 at the four corners, cutout portions 10b as concave parts having concave shapes are formed. A broken line at the top indicates a body similar to the needle 1a of the first modification formed by aggregating the thin needle pieces 14, that is, the flat top part.

The needle 1b of the second modification can be created by simply arranging easy-to-manufacture, low-cost and thin needle pieces 14 and has an effect that it can be obtained easily and at low cost. The pickup apparatus 100 in the second modification uses the needle 1b to push up the semiconductor chips 4 and is the same in other aspects.

As described above, the semiconductor manufacturing apparatus of the present first embodiment includes any one of the needles 1, 1a and 1b having a flat part on the top surface and concave portions with concave shapes at four corners, and can cause the semiconductor chips 4 to uniformly peel off from the adhesive tape 2 and perform stable pickup.

By using the pickup apparatus 100 according to the semiconductor manufacturing apparatus of the present first embodiment and executing step S3 of pickup according to the method of manufacturing a semiconductor device of the present first embodiment, it is possible to cause the semiconductor chips 4 to uniformly peel off from the adhesive tape 2 and obtain an effect of performing stable pickup without causing misalignment of the semiconductor chips 4.

Second Embodiment

A configuration of a pickup apparatus 200 according to a semiconductor manufacturing apparatus of a second embodiment of the present disclosure will be described. The second embodiment of the present disclosure is different from the first embodiment of the present disclosure in that a detection mechanism is provided below the pickup stage 8 for detecting the state of peeling off of the semiconductor chips from the adhesive tape 2 when the needle pushes up the semiconductor chips and the detection mechanism detects a peeling state of the peeled parts at four corners to control the push-up of the needle, and is the same in other aspects.

Figure 17:
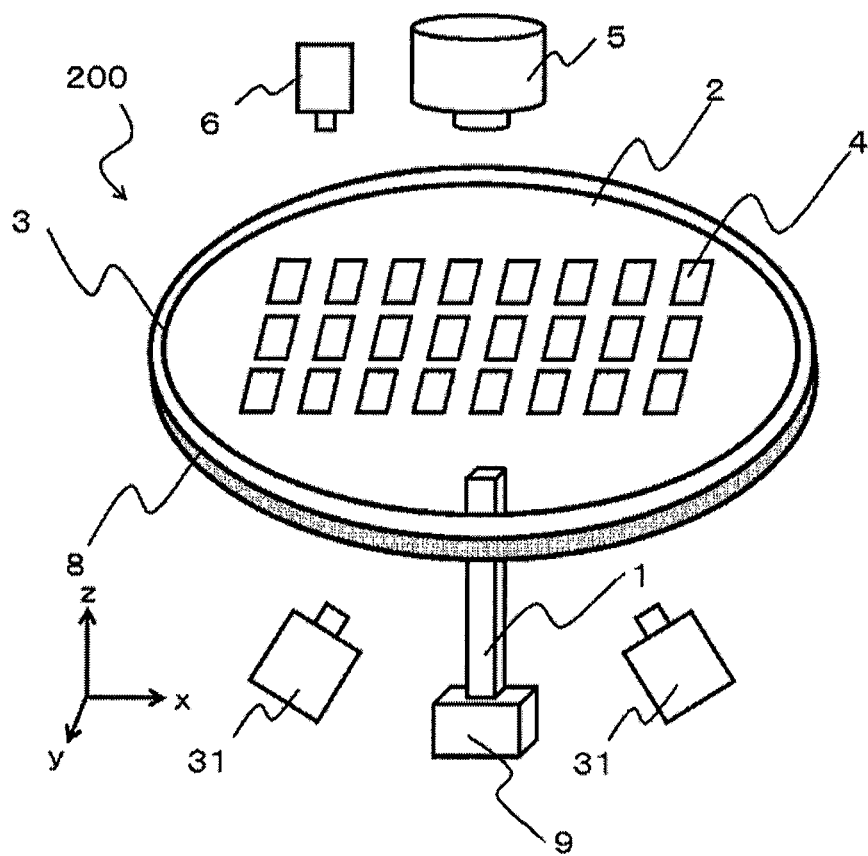
FIG. 17 is a perspective view of the pickup apparatus of the second embodiment.

FIG. 17 is a perspective view of the pickup apparatus 200 illustrating an example of the configuration of the present embodiment. In FIG. 17, components assigned the same reference numerals as those in FIG. 1 are identical or corresponding components and description thereof is omitted. Two bottom photographing cameras 31 are installed below the pickup stage 8, which operate as a detection mechanism for detecting a peeling state of the semiconductor chips 4 from the adhesive tape 2 when the needle 1 pushes up the semiconductor chips 4. By each of the bottom photographing cameras 31 photographing two of the peeled parts 13 at the four corners, the two bottom photographing cameras 31 are configured to be able to photograph the peeled parts 13 at the four corners. Note that four bottom photographing cameras 31 may be installed so that each camera takes charge of photographing each of the peeled parts 13 of the semiconductor chips 4.

Figure 18:
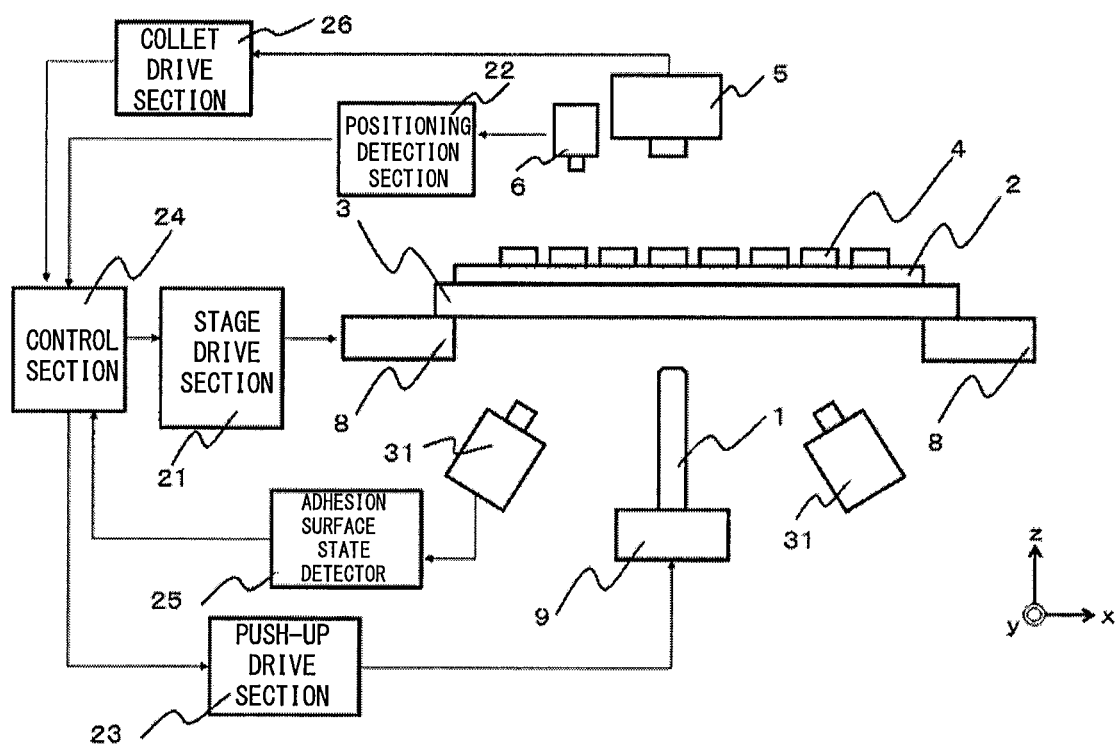
FIG. 18 is a block diagram illustrating a configuration of the pickup apparatus of the second embodiment.

FIG. 18 is a block diagram illustrating a configuration of the pickup apparatus 200 according to the second embodiment of the present disclosure. In FIG. 18, components assigned the same reference numerals as those in FIG. 2 are identical or corresponding components and description thereof is omitted. The bottom photographing cameras 31 are installed below the pickup stage 8 for detecting peeling states of the semiconductor chips 4 from the adhesive tape 2 when the needle 1 pushes up the semiconductor chips 4 and an adhesion surface state detector 25 is installed for detecting a state of adhesion surface based on images of the bottom photographing cameras 31.

Next, a method of manufacturing a semiconductor device including operation of the pickup apparatus 200 according to the semiconductor manufacturing apparatus of the second embodiment of the present disclosure will be described. Here, as in the case of the first embodiment, the semiconductor device refers to a semiconductor device or a semiconductor module such as a high frequency device, an optical device or a power module, but the semiconductor device is not limited to this, and any device using a semiconductor may be used. Hereinafter, a high frequency device will be described as an example of the semiconductor device.

The method of manufacturing a semiconductor device is similar to the flowchart in FIG. 8 in the first embodiment except some parts. Among those parts, there is a difference from the first embodiment in a detailed process of step S3, and this process will be described as "step S3a."

Figure 19:
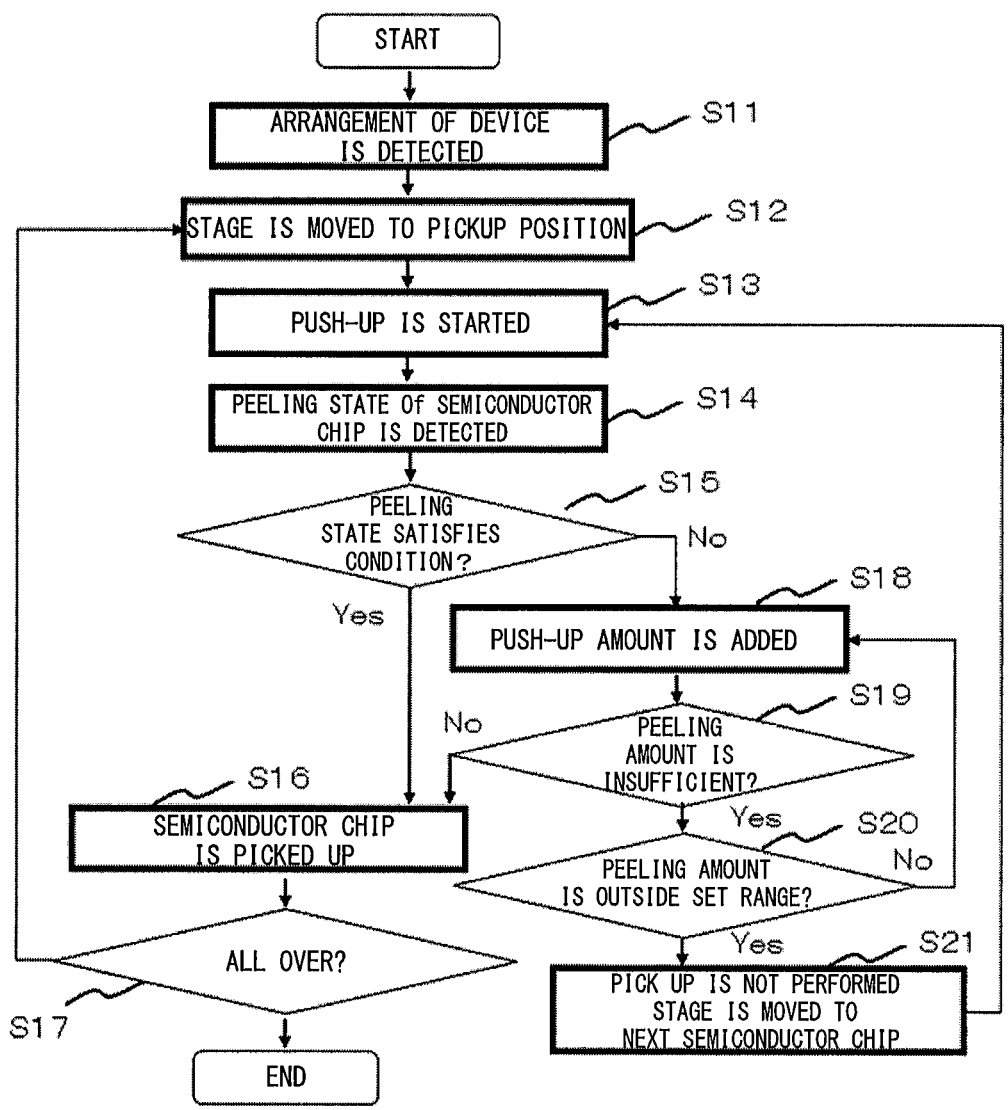

FIG. 19 is a flowchart of operation of the pickup apparatus 200 according to the semiconductor manufacturing apparatus in the pickup step S3a. In step S11, the top photographing camera 6 photographs the semiconductor chips 4, the positioning detection section 22 detects positional information relating to the arrangement of devices and transmits the positional information to the control section 24. Next, in step S12, the control section 24 sends an instruction to the stage drive section 21, moves the pickup stage 8 to a pickup position and further sends an instruction to the push-up drive section 23. In step S13, push-up of the semiconductor chips 4 is started. In step S14, peeling states of the semiconductor chips 4 from the adhesive tape 2 are photographed from below the pickup stage 8 using the bottom photographing camera 31 and the peeling states of the semiconductor chips 4 are detected.

During push-up of the semiconductor chips 4, the bottom photographing camera 31 is in the shade of the needle 1, and the peeling state on the side facing the bottom photographing camera 31 is invisible, and therefore one bottom photographing camera 31 is positioned at each of the positions facing each other across the needle 1. According to the information from the bottom photographing camera 31, the adhesion surface state detector 25 determines the peeling states and detects the peeling states of the semiconductor chips. In step S15, comparing to a parameter, which is an index as to whether the peeling states are appropriate for pickup, the control section 24 determines whether the peeling states satisfy the conditions, and if the peeling state satisfies the conditions, the flow proceeds to pickup of the semiconductor chips 4 in step S16. If the peeling state does not satisfy the conditions in step S15, the flow proceeds to step S18 where a push-up amount is added and push-up is further executed. Next, in step S19, it is determined whether the peeling amount is insufficient and if the peeling amount is sufficient, the flow proceeds to pickup of the semiconductor chips 4 in step S16 and if the peeling amount is insufficient, the flow proceeds to step S20 to determine whether the peeling amount is outside a set range. If the peeling amount is within the set range, the push-up amount is further added and if the peeling amount is outside the set range, the flow proceeds to step S21, it is assumed that an error has occurred, and pickup of the semiconductor chips 4 is suspended and the stage is moved to pick up the next semiconductor chip. When pickups of all the semiconductor chips 4 are finished, the pickup step S3a is finished.

Furthermore, step S14 of detecting the semiconductor chip peeling state and step S15 of determining whether the peeling state satisfies the conditions in FIG. 19 will be described. The bottom surfaces of the semiconductor chips 4 are photographed through the adhesive tape 2 using the bottom photographing camera 31. The portions of the semiconductor chips 4 peeled off from the adhesive tape 2 exhibit lower brightness and more blurred video compared to the adhered portions. The portions exhibiting low brightness are detected and recognized as peeled portions. When both a condition that peeling has occurred at four corners and a condition that the sum of areas of the peeled parts satisfies a parameter, which is an index as to whether peeling is possible are met, it is determined in step S15 whether the peeling states satisfy the conditions, and "Yes" is determined.

Moreover, step S19 of determining whether a peeling amount is insufficient and step S20 of determining whether the peeling amount is outside the set range in FIG. 19 will be described.

When "No" is detected in step S15 of determining whether the peeling states satisfy the conditions, push-up of the needle 1 is further added, photographing is performed using the bottom photographing camera 31, and the areas of the peeled portions are measured as in the case of step S14. In step S19 of determining whether the peeling amount is insufficient, when a condition that the sum of areas of the peeled parts satisfies the set parameter, which becomes an index as to whether pickup is possible, "No" is determined and the flow proceeds to pickup in step S16. When the sum of areas of the peeled parts does not satisfy the parameter, the flow proceeds to the next step 20 and it is determined whether the peeling amount is outside a predetermined range. If the sum of areas of the peeled parts is within the predetermined range, an addition of further predetermined push-up may be likely to increase the possibility of satisfying the parameter, whereas if the sum of areas of the peeled parts is outside the predetermined range, the sum of areas of the peeled parts does not satisfy the conditions regardless of any addition of further push-up. In step S20, it is determined whether the peeling amount is within a predetermined range and if the peeling amount is outside the range, it is determined that normal pickup of the semiconductor chip 4 is impossible and the stage is moved to proceed to the pickup step for the next semiconductor chip 4.

As described above, the bottom photographing camera 31 photographs the peeling states of the semiconductor chips 4, the adhesion surface state detector 25 detects the area of the peeled portion and the control section 24 controls the pickup apparatus 200 and picks up the semiconductor chips 4.

Figure 20:
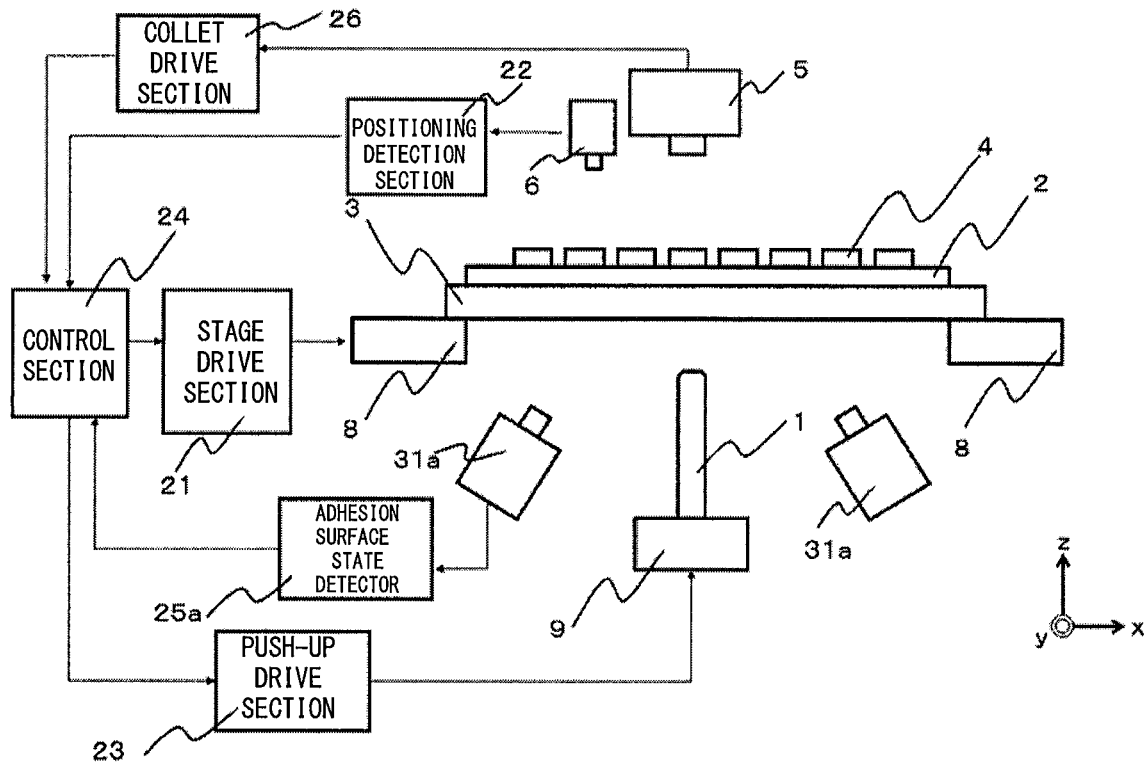
FIG. 20 is a block diagram illustrating the first modification of the pickup apparatus of the second embodiment.

Next, as a first modification of the detection mechanism of the pickup apparatus 200 according to the semiconductor manufacturing apparatus of the second embodiment, a case where a light reflecting plate sensor is used will be described. FIG. 20 is a block diagram of the first modification of the present embodiment illustrating a configuration using a light reflecting plate sensor as a detection mechanism in the pickup apparatus 200 according to the semiconductor device of the present second embodiment. In FIG. 20, components assigned the same reference numerals as those in FIG. 18 are identical or corresponding components and description thereof is omitted. In the second embodiment of the present disclosure, a light reflecting plate sensor 31a and an adhesion surface state detector 25a that receives transmission from the light reflecting plate sensor 31a and detects an adhesion surface state are installed below the pickup stage 8 to detect peeling states of the semiconductor chips 4 from the adhesive tape 2 instead of the bottom photographing camera 31 and the adhesion surface state detector 25. The rest of the configuration is the same.

The light reflecting plate sensor 31a irradiates the bottom surface of the semiconductor chips 4 with light and detects the reflected light. Note that the light is not limited to visible light, but, for example, infrared light may also be used if it is possible to detect the peeling states of the semiconductor chips 4. In FIG. 20, the light reflecting plate sensors 31a are installed at two locations, but since it is necessary to detect reflected light from four corners of the semiconductor chips 4, the light reflecting plate sensor 31a is assumed to have a mechanism with functions of irradiating the four corners with light and detecting reflected light from the four locations.

The adhesion surface state detector 25a detects the peeling state of the semiconductor chip 4 from the adhesive tape 2 based on information about the reflected light sent from the light reflecting plate sensor 31a, transmits the peeling state to the control section 24, thereby controls operation of the pickup apparatus 200 and performs a pickup operation. The operations of the pickup apparatus 200 are similar except the operations of the above-described light reflecting plate sensor 31a and the adhesion surface state detector 25a.

Figure 21:
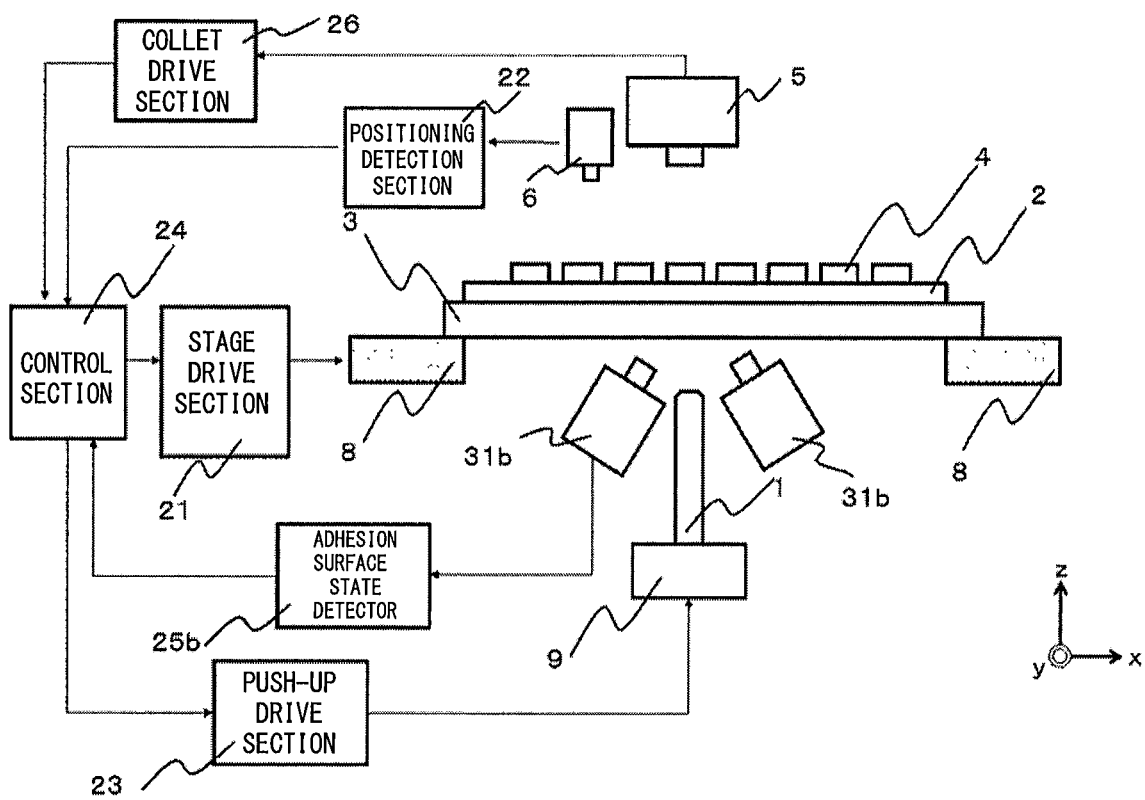
FIG. 21 is a block diagram illustrating the second modification of the pickup apparatus of the second embodiment.

Next, as a second modification of the detection mechanism of the pickup apparatus 200 according to the semiconductor manufacturing apparatus of the second embodiment, a case where an air propagation vibration detection sensor is used will be described. FIG. 21 is a block diagram of a modification of the present second embodiment illustrating a configuration using an air propagation vibration detection sensor as a detection mechanism in the pickup apparatus 200 according to the semiconductor device of the present second embodiment. In FIG. 21, components assigned with the same reference numerals as those in FIG. 18 are identical or corresponding components and description thereof is omitted. An air propagation vibration detection sensor 31b and an adhesion surface state detector 25b that receives transmission from the air propagation vibration detection sensor 31b and detects an adhesion surface state are installed below the pickup stage 8 and at positions close to the adhesive tape 2 to detect peeling states of the semiconductor chips 4 from the adhesive tape 2 instead of the bottom photographing camera 31 and the adhesion surface state detector 25 of the second embodiment of the present disclosure, and other components are the same.

The air propagation vibration detection sensor 31b detects air propagation vibration generated when the semiconductor chips 4 are peeled off from the adhesive tape 2 due to push-up of the needle 1. An example of the air propagation vibration is, for example, vibration generated by sound, but the air propagation vibration is not limited to this, and it can be any kind of vibration as long as it is detected as vibration propagating via air.

Based on the information about air propagation vibration sent from the air propagation vibration detection sensor 31b, the adhesion surface state detector 25b detects peeling states of the semiconductor chips 4 from the adhesive tape 2 and transmits the peeling state to the control section 24, and operation of the pickup apparatus 200 is thereby controlled and a pickup operation is performed. The operation of the pickup apparatus 200 is the same except for the operations of the above-described air propagation vibration detection sensor 31b and adhesion surface state detector 25b.

Figure 22:
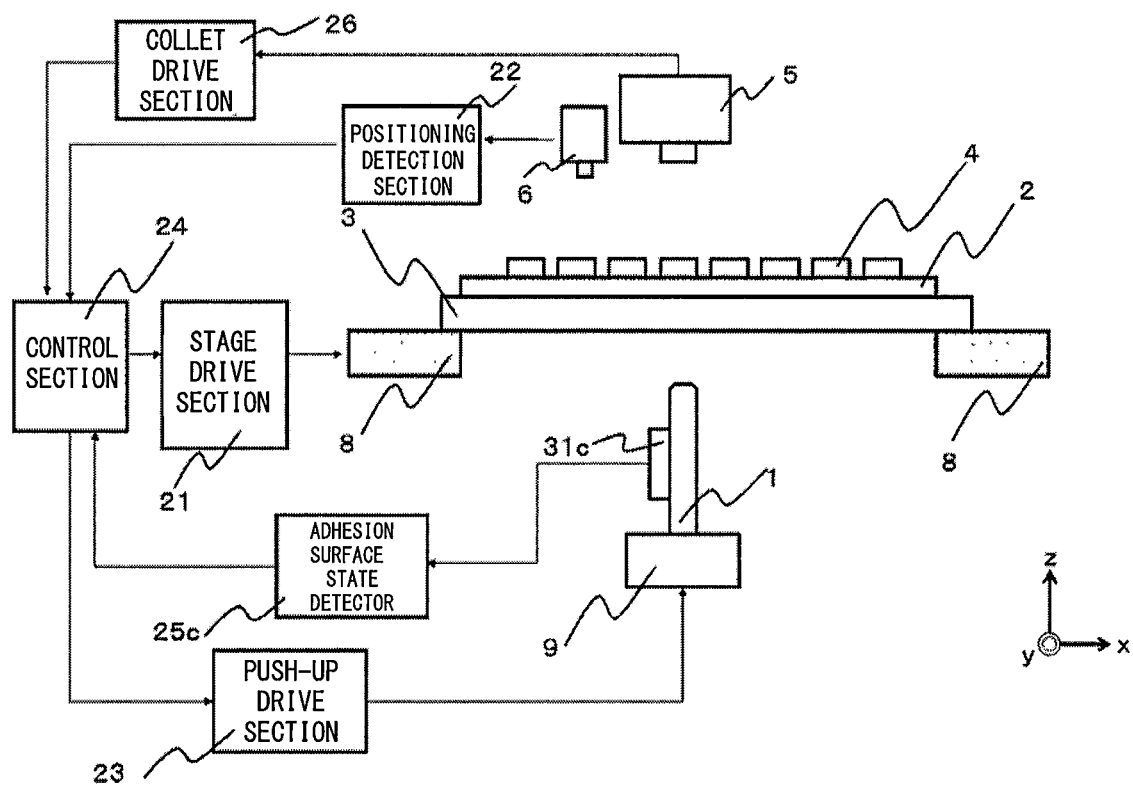
FIG. 22 is a block diagram illustrating the third modification of the pickup apparatus of the second embodiment.

Next, as a third modification of the detection mechanism of the pickup apparatus 200 according to the semiconductor manufacturing apparatus of the second embodiment, a case where a piezoelectric device is used will be described. FIG. 22 is a block diagram according to the third modification of the present embodiment illustrating a configuration using a piezoelectric device as a detection mechanism in the pickup apparatus 200 according to the semiconductor device of the present second embodiment. In FIG. 22, components assigned with the same reference numerals as those in FIG. 18 are identical or corresponding components and description thereof is omitted. A piezoelectric device 31c for detecting an elastic wave propagating via the needle 1 is attached, for example, to the needle 1 to detect peeling states of the semiconductor chips 4 from the adhesive tape 2 instead of the bottom photographing camera 31 and the adhesion surface state detector 25 in the second embodiment of the present disclosure. An adhesion surface state detector 25c that receives transmission from the piezoelectric device 31c and detects an adhesion surface state are further installed, but the rest of the configuration is the same. Although a case has been described in FIG. 22 where the piezoelectric device 31c is attached to the needle 1, the location of the piezoelectric device 31c is not limited to this, but may be any location such as the pickup stage 8 or the ring-shaped holding member 3 where it is possible to detect an elastic wave generated when the semiconductor chips 4 are peeled off from the adhesive tape 2.

The piezoelectric device 31c detects an elastic wave generated when the semiconductor chips 4 are peeled off from the adhesive tape 2 due to pushup by the needle 1.

Based on the information about vibration of the elastic wave sent from the piezoelectric device 31c, the adhesion surface state detector 25c detects peeling states of the semiconductor chips 4 from the adhesive tape 2 and transmits the peeling states to the control section 24, and operation of the pickup apparatus 200 is thereby controlled and a pickup operation is performed. The operation of the pickup apparatus 200 is the same except for the operations of the above-described piezoelectric device 31c and adhesion surface state detector 25c.

Third Embodiment

A configuration of a pickup apparatus 300 according to a semiconductor manufacturing apparatus of a third embodiment of the present disclosure will be described. The third embodiment of the present disclosure is different from the first embodiment of the present disclosure in that semiconductor chips of different sizes are mixed and a plurality of needles with different top surface sizes in contact with the semiconductor chips are placed on a needle stage 9a placed below the pickup stage 8, and the rest of the configuration is similar. Even when semiconductor chips of different sizes are mixed, it is possible to obtain the effect that semiconductor chips can be picked up stably.

Figure 23:
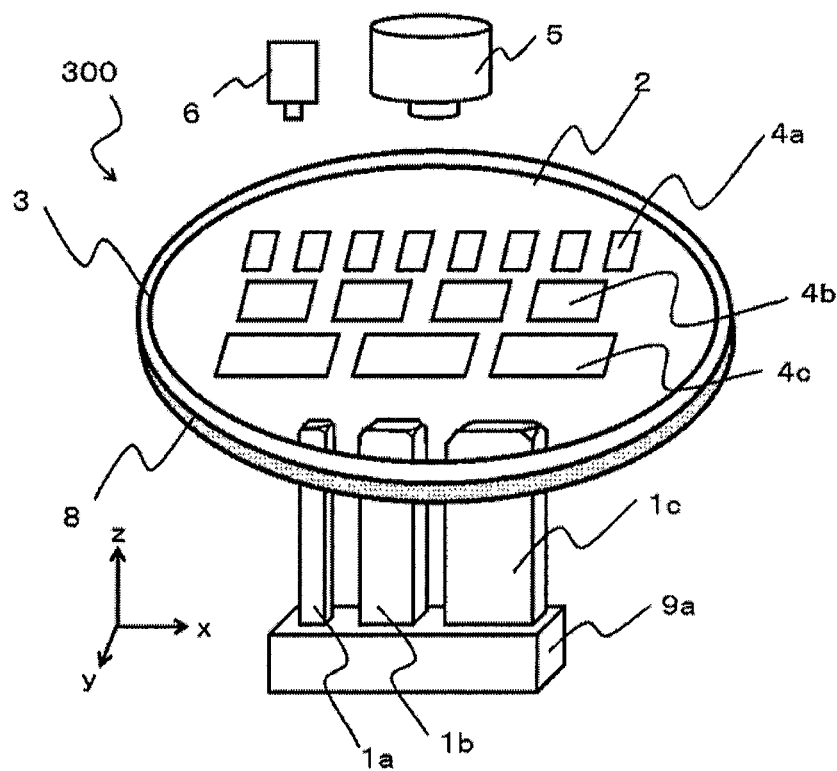
FIG. 23 is a perspective view illustrating the pickup apparatus of the third embodiment.

FIG. 23 is a perspective view of the pickup apparatus 300 according to the semiconductor manufacturing apparatus of the present third embodiment. Components assigned with the same reference numerals as those in FIG. 1 are identical or corresponding components and description thereof is omitted. Semiconductor chips 4a, 4b and 4c of different sizes are pasted on the adhesive tape 2, positioned on the ring-shaped holding member 3 and placed on the pickup stage 8. Hereinafter, the semiconductor chips 4a, 4b and 4c of different sizes will be collectively called "semiconductor chips 4z." A plurality of needles 1a, 1b and 1c are positioned on the needle stage 9a positioned below the pickup stage 8, and have top surface sizes corresponding to different sizes of the semiconductor chips 4z. The top surfaces of the the needles 1a, 1b and 1c are in contact with the semiconductor chips 4z. Hereinafter, the plurality of needles 1a, 1b and 1c are collectively called "needles 1z." The apparatus is configured such that based on image data photographed by the top photographing camera 6, the needles 1z having top surface sizes corresponding to the respective sizes of the semiconductor chips 4z can perform push-up. Note that a plurality of needles 1z having different top surface sizes are positioned in accordance with the respective sizes of the semiconductor chips 4z, and so it goes without saying that the number of needles is not restricted.

Figure 24:
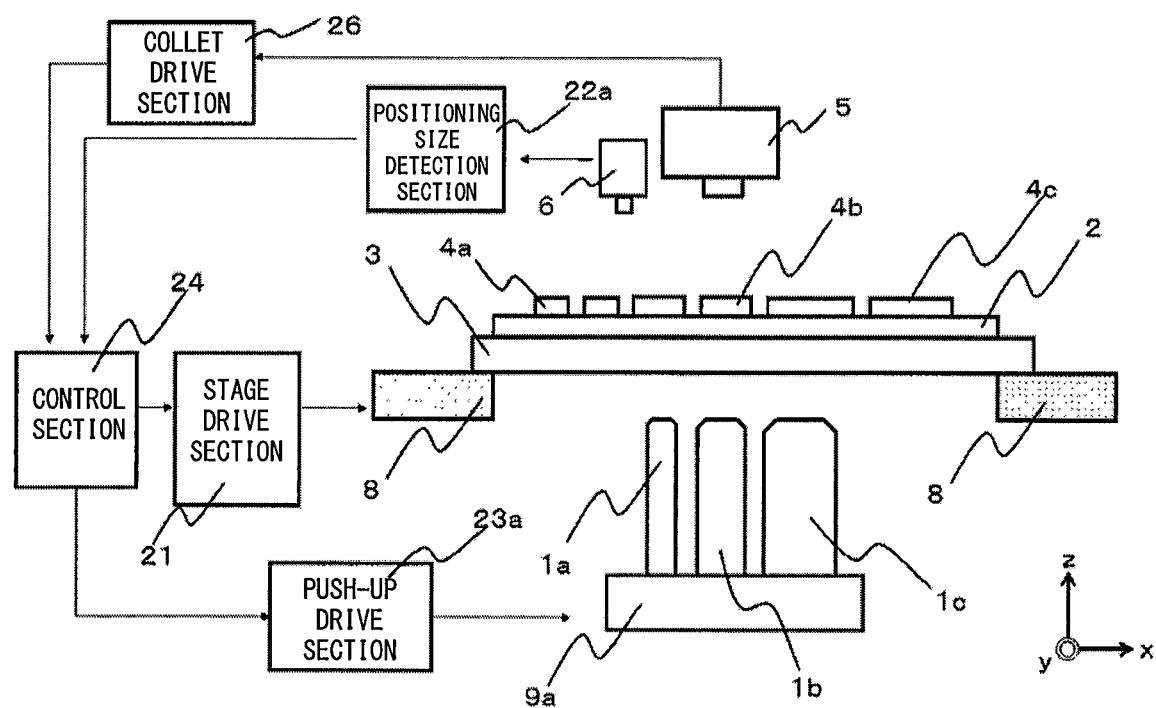
FIG. 24 is a block diagram illustrating a configuration of the pickup apparatus of the third embodiment.

FIG. 24 is a block diagram illustrating a configuration of the pickup apparatus 300 according to the third embodiment of the present disclosure. In FIG. 24, components assigned with the same reference numerals as those in FIG. 2 are identical or corresponding components and description thereof is omitted. The pickup apparatus 300 includes a positioning size detection section 22a that receives a signal from the top photographing camera 6, needles 1z having top surface sizes corresponding to the sizes of the semiconductor chips 4z, a needle stage 9a on which the needles 1z are placed to perform push-up and a push-up drive section 23a that sends a command to the needle stage 9a about which sized needle 1z is to be pushed up.

Next, a method of manufacturing a semiconductor device including operation of the pickup apparatus 300 according to the semiconductor manufacturing apparatus of the third embodiment of the present disclosure will be described. Here, as in the case of the first embodiment, the semiconductor device refers to a semiconductor device or a semiconductor module such as a high frequency device, an optical device or a power module, but the semiconductor device is not limited to this, and any device using a semiconductor may be used. Hereinafter, a high frequency device will be described as an example of the semiconductor device.

Except for some parts, the method of manufacturing a semiconductor device is similar to the flowchart in FIG. 8 in the first embodiment. Among those parts, there is a difference from the first embodiment in a detailed process of step S3, and so this process will be described as "step S3b."

In step S3b, image information photographed by the top photographing camera 6 positioned above the pickup stage 8 is sent to the positioning size detection section 22a, positional information about the sizes and positions of the semiconductor chips 4 is detected, and transmitted to the control section 24. The control section 24 transmits the positional information of the semiconductor chips 4 to the stage drive section 21 and moves the pickup stage 8 to the position at which the semiconductor chips 4 are picked up. At the same time, the control section 24 transmits the size information of the semiconductor chips 4 to the push-up drive section 23a, the push-up drive section 23a sends a command to the needle stage 9a so as to select a needle corresponding to a size of each semiconductor chip 4 to perform push-up. The needle stage 9a performs push-up for only the needle 1z corresponding to the size of the semiconductor chip 4z. The needle pushes up the semiconductor chips 4z through the adhesive tape 2 and separates the four corners of the semiconductor chip 4 from the adhesive tape 2. In accordance with this, the collet 5 suctions the semiconductor chip 4z from above, moves the semiconductor chip 4z in the z direction and performs pickup.

As described above, even when semiconductor chips of different sizes are mixed and pasted on the adhesive tape, by pushing up needles having top surface sizes corresponding to the sizes of the semiconductor chips 4, it is possible to generate peeled parts at the four corners without causing the semiconductor chips 4 to be peeled off excessively from the adhesive tape 2. Thus, it is possible to generate peeling off of the semiconductor chips 4 from the adhesive tape 2 uniformly and perform stable pickup without causing misalignment of the semiconductor chips 4.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2019-093831, filed on May 17, 2019 including specification, claims, drawings and summary, on which the convention priority of the present application is based, is incorporated herein by reference in its entirety.

The invention claimed is:

1. A semiconductor manufacturing apparatus comprising:
    a holding member holding an adhesive tape on which a semiconductor chip is pasted;
    a pickup stage on which the holding member is placed;
    a stage drive section controlling a movement of the pickup stage;
    a top photographing camera positioned above the pickup stage and photographing a position of the semiconductor chip;
    a positioning detection section detecting positional information of the semiconductor chip based on video information provided from the top photographing camera;
    a collet picking up the semiconductor chip;
    a collet drive section controlling the collet;
    a needle located below the pickup stage, having a width equivalent to that of the semiconductor chip, having a flat part on a top surface and concave portions at four corners of the top surface, and pushing up a holding member for pickup of the semiconductor chip;
    a needle stage holding the needle;
    a push-up drive section driving the needle stage; and
    a control section instructing the stage drive section to move the stage based on the positional information from the positioning detection section, instructing the push-up drive section to push up the semiconductor chip, and instructing the collet drive section to suction the semiconductor chip pushed up by the needle from above.

2. The semiconductor manufacturing apparatus according to claim 1, further comprising:
    a detection mechanism detecting a peeling state of the adhesive tape from four corners of the semiconductor chip; and
    an adhesion surface state detector determining, based on information from the detection mechanism, whether the peeling state is appropriate for pickup and whether to pick up,
    wherein the control section instructs, based on information from the adhesion surface state detector, to perform push-up so that the peeling state becomes appropriate for pickup.

3. The semiconductor manufacturing apparatus according to claim 2, wherein the detection mechanism includes a photographing camera.

4. The semiconductor manufacturing apparatus according to claim 2, wherein the detection mechanism includes a light reflecting plate sensor.

5. The semiconductor manufacturing apparatus according to claim 2, wherein the detection mechanism includes an air propagation vibration detection sensor.

6. The semiconductor manufacturing apparatus according to claim 2, wherein the detection mechanism includes a piezoelectric device.

7. The semiconductor manufacturing apparatus according to claim 1, wherein the needle includes a plurality of needles for respective sizes of semiconductor chips of different sizes, and the control section selects one of the needles corresponding to a size of each semiconductor chip.

8. A method of manufacturing a semiconductor device comprising:
- placing a holding member holding an adhesive tape on which a diced semiconductor chip is pasted on a pickup stage;
- pushing up the semiconductor chip through the adhesive tape with a needle having a flat part on a top surface and concave portions at four corners of the top surface; and
- suctioning the semiconductor chip from above and picking up the semiconductor chip with a collet.

9. The method of manufacturing a semiconductor device according to claim 8, further comprising:
- detecting a peeling state of the adhesive tape from four corners of the semiconductor chip with a detection mechanism; and
- determining whether the peeling state is appropriate for pickup with an adhesion surface state detector.

* * * * *